United States Patent [19]
Huddleston
[11] 3,829,648
[45] Aug. 13, 1974

[54] MAKE AND BREAK ELECTRICAL CONTACT

[75] Inventor: Robert F. Huddleston, Indianapolis, Ind.

[73] Assignee: P. R. Mallory & Co. Inc., Indianapolis, Ind.

[22] Filed: Aug. 21, 1972

[21] Appl. No.: 282,558

Related U.S. Application Data

[63] Continuation of Ser. No. 92,490, Nov. 24, 1970, abandoned.

[52] U.S. Cl. .......... 200/264, 29/630 C, 200/292
[51] Int. Cl. .......... H01h 1/02
[58] Field of Search .......... 200/166 PC, 166 C; 174/68.5; 335/199; 29/630 C, 630 R

[56] References Cited

UNITED STATES PATENTS

| | | | |
|---|---|---|---|
| 3,219,781 | 11/1965 | Miller et al. | 335/199 X |
| 3,293,399 | 12/1966 | Heinrich | 200/166 PC |
| 3,423,517 | 1/1969 | Arrhenius | 174/68.5 |
| 3,550,157 | 12/1970 | Pfleger | 200/166 PC |

*Primary Examiner*—James R. Scott
*Assistant Examiner*—William J. Smith
*Attorney, Agent, or Firm*—Charles W. Hoffmann; Robert F. Meyer

[57] ABSTRACT

Electrical conducting paths of a metallic composite, which includes an electrically conductive material and a refractory metal, are formed on an insulative base in a predetermined pattern.

4 Claims, 4 Drawing Figures

MAKE AND BREAK ELECTRICAL CONTACT

This is a continuation of application Ser. No. 92,490, filed Nov. 24, 1970.

This invention relates to an electrical conducting means; and more particularly, to an electrical conducting means wherein electrical conducting paths are formed on an electrically insulative base of a predetermined pattern.

The principles of this invention are particularly useful in connection with devices commonly referred to as printed circuits, and for this reason will be discussed in connection with such devices.

Prior to the present invention, the materials commonly used as the conductors in printed circuits were those of copper, silver-plated copper, silver and gold plating on silver plated copper. These materials are usually adhesive bonded to some form of an insulative base. The circuit is then usually created by the photo-etched process. Alternatively, the circuit can be formed by stamping the circuit from the materials and then bonding the same to the insulative base. The so-formed printed circuit is used to carry an electrical current.

In general, prior art printed circuit applications are limited by the current carrying capabilities of the electrically conductive material which is used to create the circuit paths. This is particularly true in switching applications where there is a make and break of electrical contacts or where there is a wiping electrical contact circuit. In such applications, mechanical wear, erosion due to arcing and excessive resistance causing excessive heat greatly shortens the life of the circuit board. In an attempt to overcome these problems, the prior art has sometimes plated copper at the contact area with another metal such as rhodium. This requires etching the copper and plating with nickel as a backup material for the harder more expensive contact material. Using this rather complicated, expensive technique, the plated contact area is still more or less limited to maximum current loads of about two amperes when used to make or break an electrical load, and/or a sliding contact application.

The present invention is concerned with electrical conducting means such as printed circuit boards and a method of making the same and has as one of its objects the provision of an electrical conducting means which has longer life.

Another object of the invention is to provide a printed circuit means which has better electrical erosion properties.

Still another object of the invention is to provide a printed circuit means having better resistance to mechanical wear.

Still another object of the invention is to provide a printed circuit means for electrical switching applications.

Another object of the invention is to provide a printed circuit means for wiping electrical contact applications.

Another object of the invention is to provide a printed circuit means for switching applications having greater resistance to arcing.

A further object of the invention is to provide an electrical circuit means wherein the electrical conductive circuits are fabricated from a metallic composite which includes an electrically conductive material and a refractory metal.

Yet another object of the invention is to provide a printed circuit means wherein the electrically conductive circuits are fabricated from a composite of an electrically conductive material and a refractory metal which has been pressure rolled to a predetermined thickness.

These and other objects thereof will become apparent from the following description taken in conjunction with the accompanying drawings wherein like reference numbers describe elements of a similar function.

Generally speaking, the objects of the invention are accomplished by providing an electrical conducting means which in general comprises an electrically insulative base, electrically conductive paths of a composite of an electrically conducting material and a refractory metal attached to the base in a predetermined pattern, and electrical terminals associated with the paths. More specifically, the composite used to form the electrically conductive paths is a relatively thin material which has been pressure rolled to the desired thickness.

Figure 1:
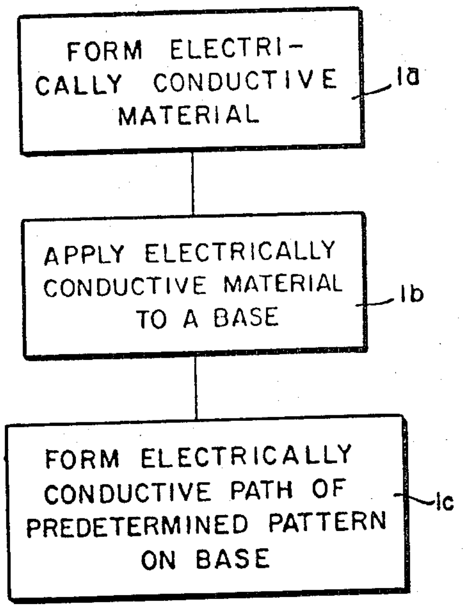
FIG. 1 is a block diagram showing the steps used in forming the electrical conducting means according to one method of the invention.

Referring now to FIG. 1, there is shown one method of forming the electrically conducting means or, as will be described, the printed circuit board of the present invention. In step 1*a*, the electrically conductive material is formed first. Basically, the electrically conductive material is formed by a pressure rolling process in which the materials are pressure rolled into sheets or strips. To this end, powders of a refractory material taken from the group consisting essentially of tungsten, titanium, molybednum and carbides thereof, cadmium oxide and mixtures thereof are blended together with powders of a high electrically and thermally conductive material such as copper or silver. These powders are then pressed and sintered. The pressed and sintered powders are then pressure rolled to about a one third reduction in thickness and then are resintered. The resintered material is then pressure rolled again. Subsequently, the material is reduced to the desired thickness in cycles of rolling and annealing to form a composite of an electrically conductive material and a refractory metal.

The use of the refractory material provides a skeleton to thus act as a deterrent to arc erosion. Thus, this material is particularly adaptable to those circuit board applications where there is a make and break of electrical contacts. The process of pressing, rolling and sintering of the powders provides an electrically conducting material wherein the refractory particles are in intimate contact with a continuous matrix of the electrically conductive material such that the material will have a relatively high electrical conductivity. The material is further characterized by the refractory particles being layered in a predetermined direction. To insure that the intimate contact between the refractory particles and the particles of the electrically conductive material is achieved, the particle size of the refractory is preferably maintained between 4–20 microns by F.A.P.S. analysis. The sintering and annealing is carried out in a non-oxidizing atmosphere.

In general, the composition, that is, the weight percent of the refractory metal and the electrically conductive material is dependent upon the electrical properties desired and, in the case of the present invention the rolling ability of the mixture. With too little electrically conductive material, the rolling operation becomes very difficult due to the high refractory material content. On the other hand, with too little refractory metal content, the arc resistance and erosion properties of the material is reduced. In general, the electrically conductive material should be in an amount of about 15–90% by weight of the composite, with the balance being the refractory metal. Table I shows the ranges and the preferred percentages of silver and copper for some of the named refractory materials of the invention.

TABLE I

| Refractory material | %-Ag — by weight Range | %-Cu — by weight Range |
|---|---|---|
| Tungsten | 20–90 | 20–90 |
| Tungsten Carbide | 35–90 | 25–90 |
| Molybdenum | 35–90 | 20–90 |
| Cadmium Oxide | 75–95 | |
| CdO+W or WC or Mo | 15–85 | |

As shown in step 1*b*, the rolled composite of electrically conductive material and the refractory metal is then applied to a suitable base. The base is electrically insulative and is formed from a suitable epoxy or plastic. The material may be applied to the base by a suitable adhesive such as those of epoxies or glues. In step 1*c*, the rolled composite is then formed into electrically conductive paths in a predetermined pattern. This step may be performed by photo-fabrication such as photo-etching techniques commonly used in the present circuit board art.

Figure 2:
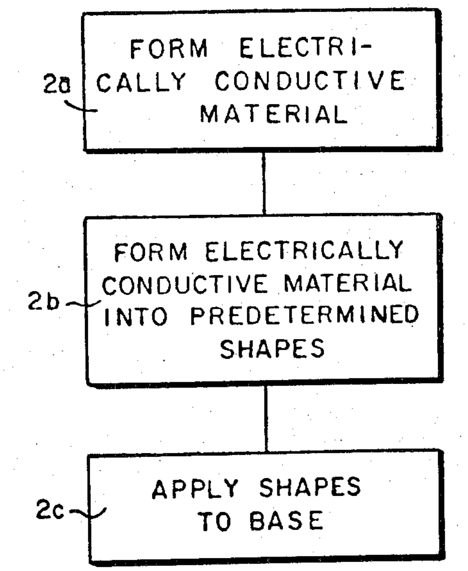
FIG. 2 is another block diagram showing the steps according to another method of forming the electrical conducting means.

Referring now to FIG. 2, another method of forming the printed circuit board of the present invention is shown. In step 2*a*, the electrically conductive material and refractory metal is first formed as a composite. This is done by the same pressure rolling process as was done in step 1*a* of FIG. 1. As indicated in step 2*b*, the electrically conductive material formed in step 2*a* is then formed into predetermined shapes. Such predetermined shapes can be formed, for example, by "blanking out" shapes from rolled sheet material. As another alternative, lengths of the material can be cut from strips of the rolled material. As indicated in step 2*c*, the so-formed predetermined shapes are then applied to a base material. As in step 1*c*, the base would be an electrically insulative material of a suitable plastic and the shapes would be applied through the use of a suitable adhesive.

Figure 3:
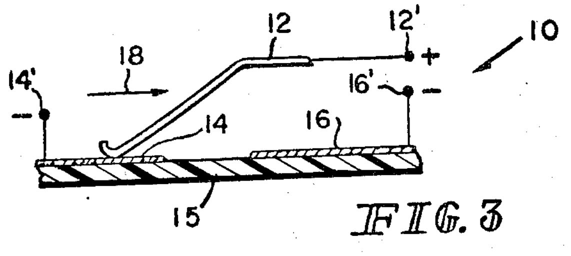
FIG. 3 is a cross section of a typical printed circuit board used in a wiping electrical contact circuit.

Referring now to FIG. 3, there is shown, in a partial cross section, a typical circuit board wherein the composite of electrically conductive material and refractory metal is used in a wiping contact circuit application. As shown, printed circuit board 10 includes electrically conductive paths 14 and 16 which are applied to an electrically insulative base 15, the electrically conductive material being formed and applied to the base through one of the methods of either FIGS. 1 or 2 to form a pattern of electrically conductive material. A wiper 12 is connected to terminal 12'. The electrically conductive material is connected to external terminals 14' and 16' which are connected to their respective loads. Wiper blade 12 moves in the direction of the arrow 18 so as to pass over the electrically conductive paths formed by the materials 14 and 16. Such a circuit board and wiping contact may be a rotary switch, for example.

Figure 4:
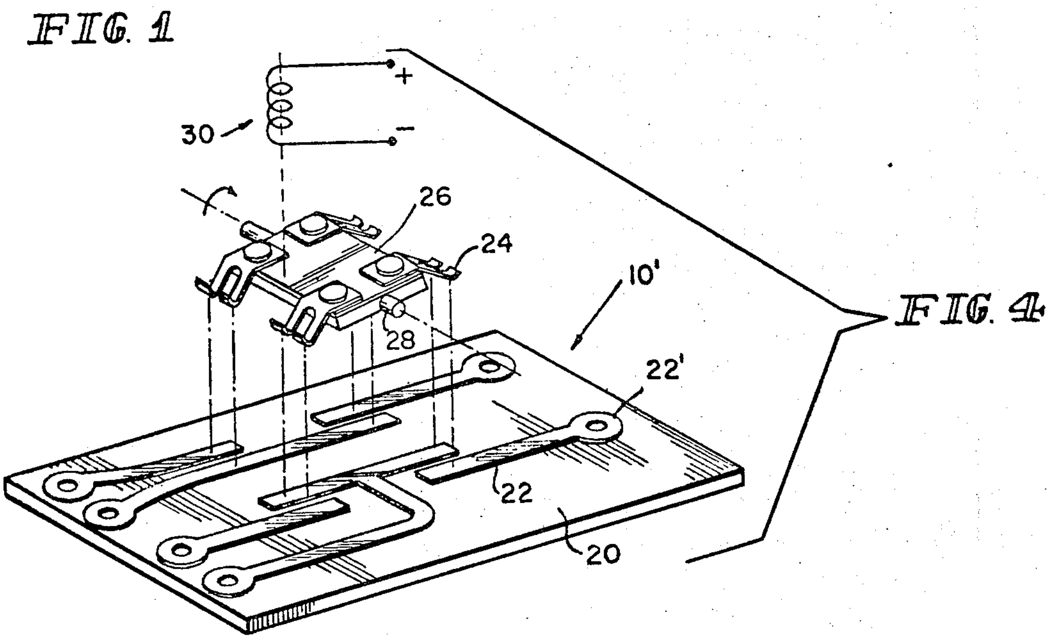
FIG. 4 is an exploded view showing a printed circuit board adapted to electrical switching applications.

Referring now to FIG. 4, there is shown an exploded view of a circuit board wherein a switching circuit is used. More particularly, the switching circuit is of the relay type wherein there is a make and break between movable and fixed contacts. As shown, the circuit board 10' is of the relay type and includes an insulative base 20 having bonded thereto electrically conductive paths 22 formed in a predetermined pattern. Paths 22 include electrical terminals 22'. The electrical conductive paths 22 are formed of a composite of electrically conductive material and refractory metal by either of the methods of FIGS. 1 or 2. Movable contacts 24 are carried by a plate 26 which is pivotally mounted on a shaft means 28. The movable contacts are pivotally actuated to engage the paths 22 in accordance with a suitable drive means such as solenoid means 30. The pivoting of the contacts 24 makes and breaks the contacts with the ends of the conductive path 22 to thus open and close electrical circuits in accordance with a predetermined sequence.

It has been found that the electrically conductive material of the present invention is particularly adaptable to operating an on-off, make and break circuit such as shown in FIG. 4 for longer periods of time and at higher operating current loads due to the materials resistance to arc erosion and because of lower contact resistance. Thus it has been found that at operating currents above 2 amperes, standard relays using prior art materials operated at considerably higher resistance and had much shorter operating life than the materials of the present invention.

What is claimed is:

1. A printed circuit board comprising an electrically insulative base member, fixed electrically conducting paths of a composite pressure rolled to a predetermined thickness and consisting essentially of an electrically conductive material taken from the group consisting essentially of copper and silver and a refractory metal taken from the group consisting essentially of tungsten, tungsten carbide, molybdenum, carbides thereof, cadmium oxide and mixtures thereof carried on a surface of said base member in a predetermined pattern, and movable electrical terminal means which provide contact with said electrically conductive paths, said electrically conductive paths carrying an electrical load of at least 2 amperes.

2. An electrical conducting means according to claim 1 wherein said pattern provides a switching circuit.

3. An electrical conducting means according to claim 2 wherein said switching circuit is of the relay type.

4. An electrical conducting means according to claim 1 wherein said pattern provides sliding contact switching.

* * * * *